United States Patent
Sipe et al.

(10) Patent No.: US 10,170,896 B2
(45) Date of Patent: *Jan. 1, 2019

(54) ENCLOSURE, AND WINDOW ASSEMBLY AND ASSEMBLING METHOD THEREFOR

(71) Applicant: EATON CORPORATION, Cleveland, OH (US)

(72) Inventors: Warren Clift Sipe, Cleveland, TN (US); Richard Donald Prohaska, Cleveland, TN (US); Gilbert Ricky Carson, Cleveland, TN (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 15/868,175

(22) Filed: Jan. 11, 2018

(65) Prior Publication Data

US 2018/0138669 A1    May 17, 2018

Related U.S. Application Data

(63) Continuation of application No. 15/135,613, filed on Apr. 22, 2016, now Pat. No. 9,899,808.

(60) Provisional application No. 62/281,777, filed on Jan. 22, 2016.

(51) Int. Cl.
| | |
|---|---|
| *H02B 1/30* | (2006.01) |
| *H05K 5/06* | (2006.01) |
| *H05K 5/03* | (2006.01) |
| *H05K 5/02* | (2006.01) |
| *H02B 1/38* | (2006.01) |

(52) U.S. Cl.
CPC ............... *H02B 1/306* (2013.01); *H02B 1/38* (2013.01); *H05K 5/0217* (2013.01); *H05K 5/03* (2013.01); *H05K 5/069* (2013.01)

(58) Field of Classification Search
CPC ........ H02B 1/306; H02B 1/30; H05K 5/0217; H05K 5/03; H05K 5/069
USPC .......................................................... 174/50
See application file for complete search history.

(56) References Cited

U.S. PATENT DOCUMENTS

| | | | |
|---|---|---|---|
| 6,852,924 B2 | 2/2005 | Lessard | |
| 7,358,411 B2 | 4/2008 | Seff et al. | |
| 7,569,770 B2 | 8/2009 | Remmert et al. | |
| 7,688,573 B2 | 3/2010 | Ranta | |
| 7,969,750 B2 | 6/2011 | Jur et al. | |
| 7,974,078 B2 | 7/2011 | Coomer et al. | |
| 8,901,417 B2 | 12/2014 | Herring et al. | |
| 9,263,864 B2 | 2/2016 | Partridge et al. | |
| 9,521,763 B2 * | 12/2016 | Lee .......................... | H05K 5/02 |

* cited by examiner

*Primary Examiner* — Dhirubhai R Patel
(74) *Attorney, Agent, or Firm* — Eckert Seamans

(57) ABSTRACT

A window assembly is for an enclosure. The enclosure has a plurality of walls. The window assembly includes a cover member structured to be coupled to each of the plurality of walls in order to form an enclosed region; a window member coupled to the cover member; a frame member coupled to the cover member; and a number of stud members each secured to the frame member and extending through the cover member. The cover member is located between the frame member and the window member.

24 Claims, 4 Drawing Sheets

ENCLOSURE, AND WINDOW ASSEMBLY AND ASSEMBLING METHOD THEREFOR

CROSS-REFERENCE TO RELATED APPLICATIONS

This application claims priority from and claims the benefit of U.S. patent application Ser. No. 15/135,613, filed Apr. 22, 2016, now U.S. Pat. No. 9,899,808 entitled "ENCLOSURE, AND WINDOW ASSEMBLY AND ASSEMBLING METHOD THEREFOR," which claims priority from and claims the benefit of U.S. Provisional Patent Application Ser. No. 62/281,777, filed Jan. 22, 2016, entitled "ENCLOSURE, AND WINDOW ASSEMBLY AND ASSEMBLING METHOD THEREFOR."

BACKGROUND

Field

The disclosed concept relates to enclosures such as, for example, electrical enclosures. The disclosed concept also relates to window assemblies for enclosures. The disclosed concept further relates to methods of assembling window assemblies.

Background Information

Enclosures, such as electrical enclosures, commonly include window assemblies which allow operating personnel to see inside the enclosure. This is advantageous for electrical enclosures that include, for example, fusible switches. The window assembly provides a safety mechanism by allowing operating personnel to easily determine, before the enclosure is opened, whether electrical contacts of the fusible switch are open or closed. Known window assemblies include window members, door members, stud members, and a frame member. In order to assemble a known window assembly, the stud members are permanently secured to the door member, which is then aligned with the remaining components by pushing the stud members through the window member and the frame member. In order to secure the stud members at the end opposite the door member, a nut or other similar securing member is fastened to the stud members. This assembly process presents many challenges. First, aligning the door member is difficult because of the weight of the door member. More specifically, the door member is significantly heavier than other components of the enclosure. Thus, manipulating the door member so that the relatively small stud members are aligned with holes in the window member and the frame member is burdensome. Additionally, because manipulating the door member is difficult, the stud members that are permanently secured to the door member often get caught on other nearby equipment and as a result get damaged.

There is thus room for improvement in enclosures and in window assemblies therefor. There is also room for improvement in methods of assembling window assemblies.

SUMMARY

These needs and others are met by embodiments of the disclosed concept, which are directed to an enclosure, and window assembly and assembling method therefor, in which a cover member is located between a frame member and a window member.

As one aspect of the disclosed concept, a window assembly for an enclosure is provided. The enclosure has a plurality of walls. The window assembly comprises a cover member structured to be coupled to each of the plurality of walls in order to form an enclosed region; a window member coupled to the cover member; a frame member coupled to the cover member; and a number of stud members each secured to the frame member and extending through the cover member. The cover member is located between the frame member and the window member.

As another aspect of the disclosed concept, an enclosure comprises a plurality of walls; and a window assembly comprising a cover member coupled to each of the plurality of walls in order to form an enclosed region, a window member coupled to the cover member, a frame member coupled to the cover member, and a number of stud members each secured to the frame member and extending through the cover member. The cover member is located between the frame member and the window member.

As another aspect of the disclosed concept, a method of assembling a window assembly is provided. The window assembly includes a cover member having a number of clearance holes, a window member, a frame member, and a number of stud members secured to the frame member. The method comprises the steps of aligning the number of stud members with the clearance holes of the cover member; and extending each of the number of stud members through a corresponding one of the clearance holes of the cover member. The cover member is located between and is coupled to the frame member and the window member.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts.

As employed herein, the statement that two or more parts or components "engage" one another shall mean that the parts touch and/or exert a force against one another either directly or through one or more intermediate parts or components.

As employed herein, the term "coupling member" refers to any suitable connecting or tightening mechanism expressly including, but not limited to, rivets, screws, bolts and the combinations of bolts and nuts (e.g., without limitation, lock nuts), washers and nuts, zip ties, and wire ties.

Figure 1:
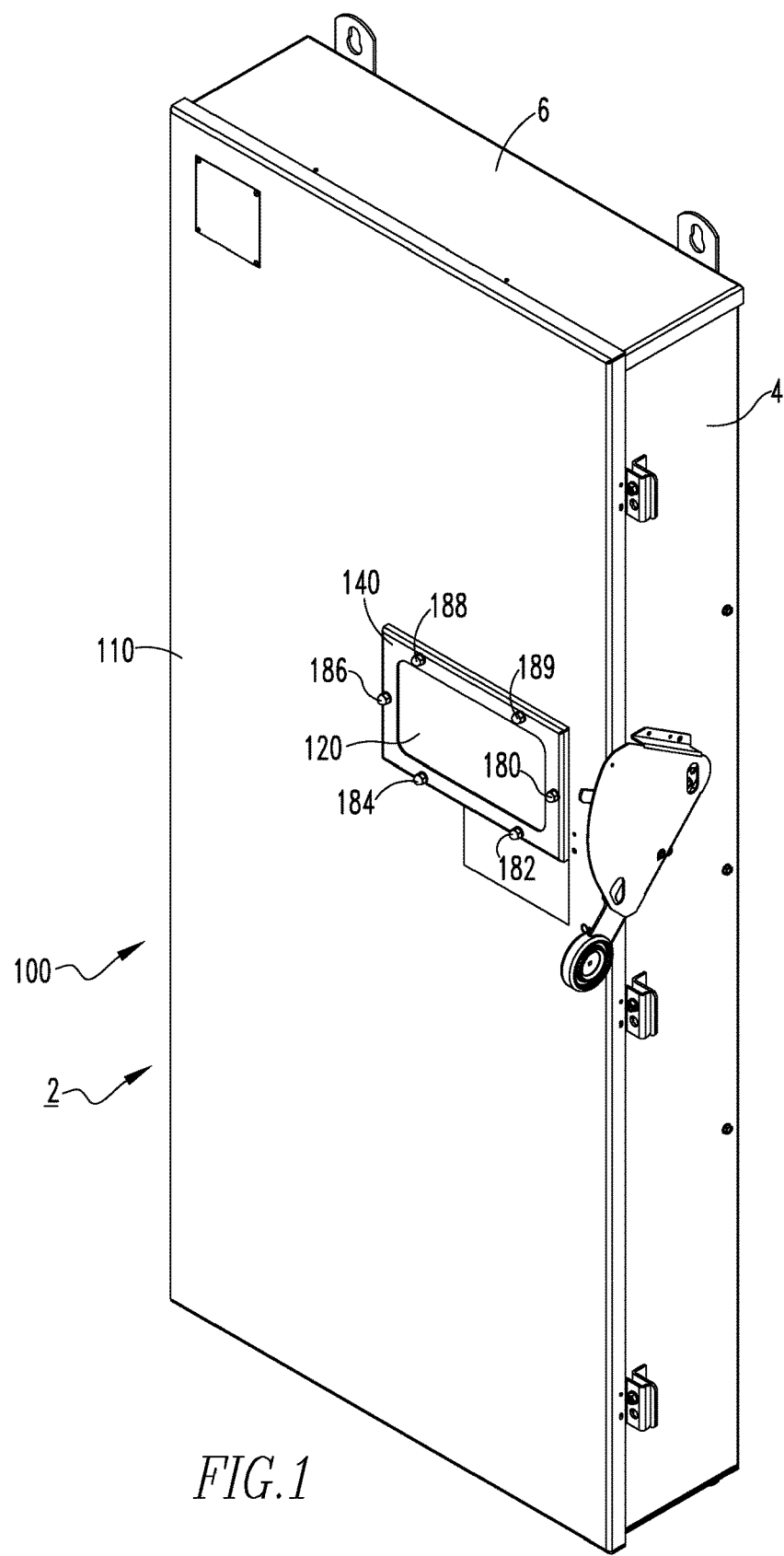
FIG. 1 is a front isometric view of an enclosure and window assembly therefor, in accordance with a non-limiting embodiment of the disclosed concept.

FIG. 1 shows an electrical enclosure 2, in accordance with a non-limiting embodiment of the disclosed concept. The example electrical enclosure 2 includes a number of walls (two walls 4,6 are shown in FIG. 1) and a window assembly 100 coupled to the walls 4,6. The electrical enclosure 2 also includes a number of fusible disconnect switches (not shown, but located internal with respect to the walls 4,6 and the window assembly 100) that are viewable through the window assembly 100. As will be discussed in greater detail below, the window assembly 100 is relatively easy to assemble, install in the electrical enclosure 2, and repair when damaged in the field. This is distinct from prior art window assemblies (not shown) whose assembly methods require manipulating/aligning relatively heavy cover members, or doors, with other window assembly components, a method that is time consuming and costly in terms of the labor involved and potential damage to particular components.

Figure 2:
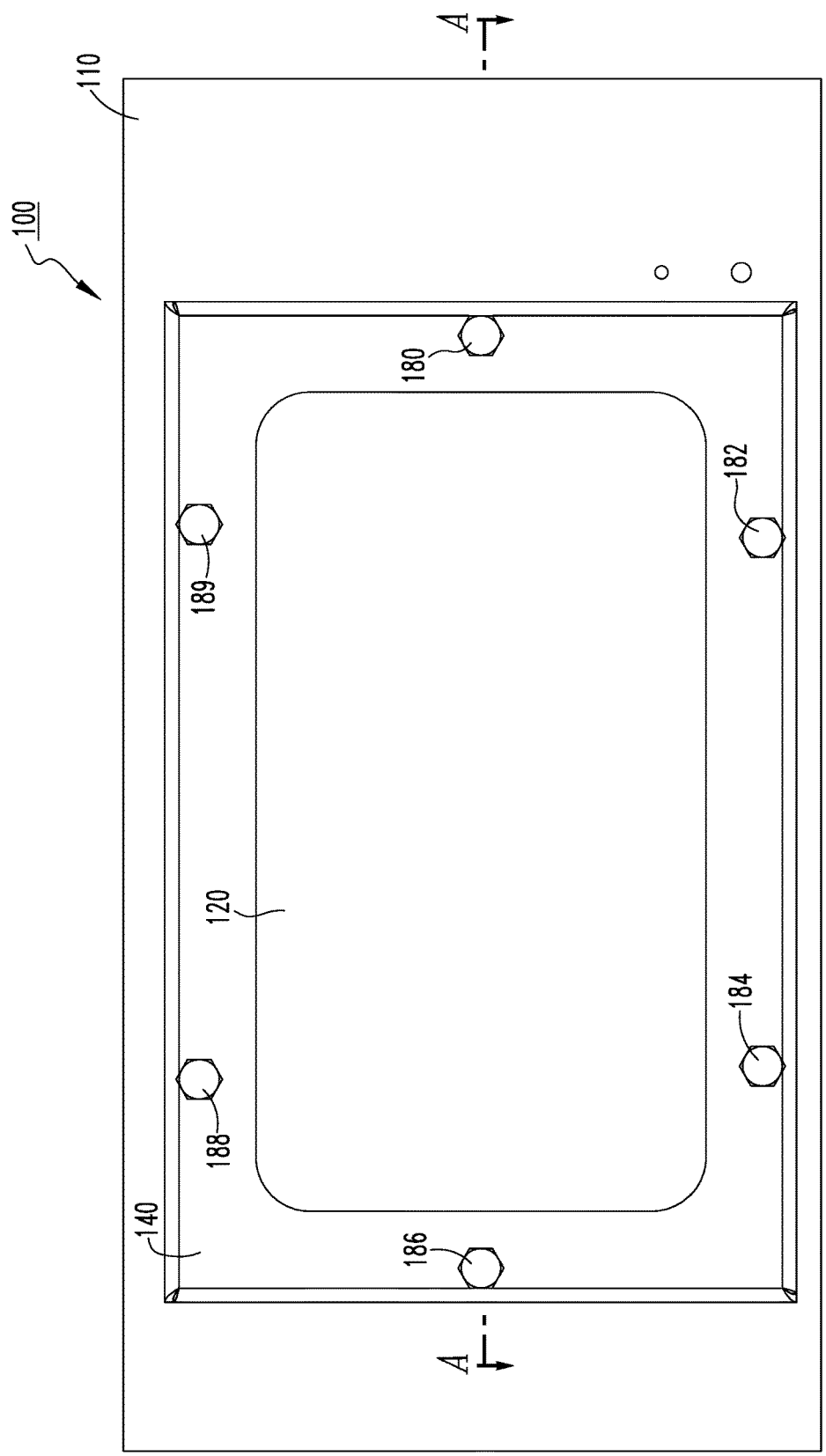
FIG. 2 is a front elevation view of a portion of the window assembly of FIG. 1.
Figure 3:
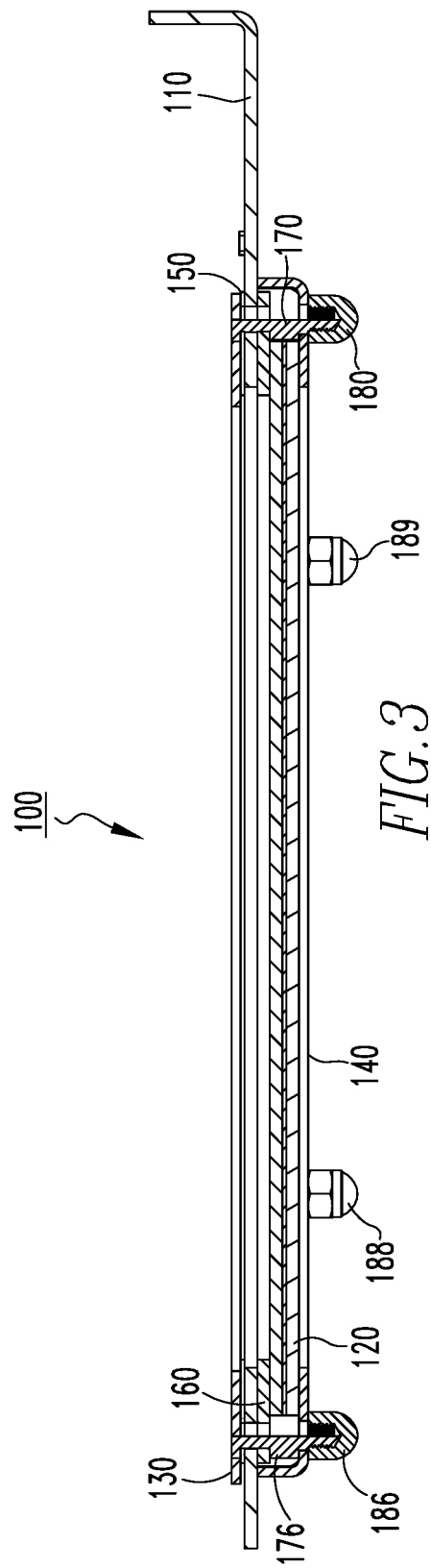
FIG. 3 is a section view of the window assembly of FIG. 2, taken along line A-A of FIG. 2.
Figure 4:
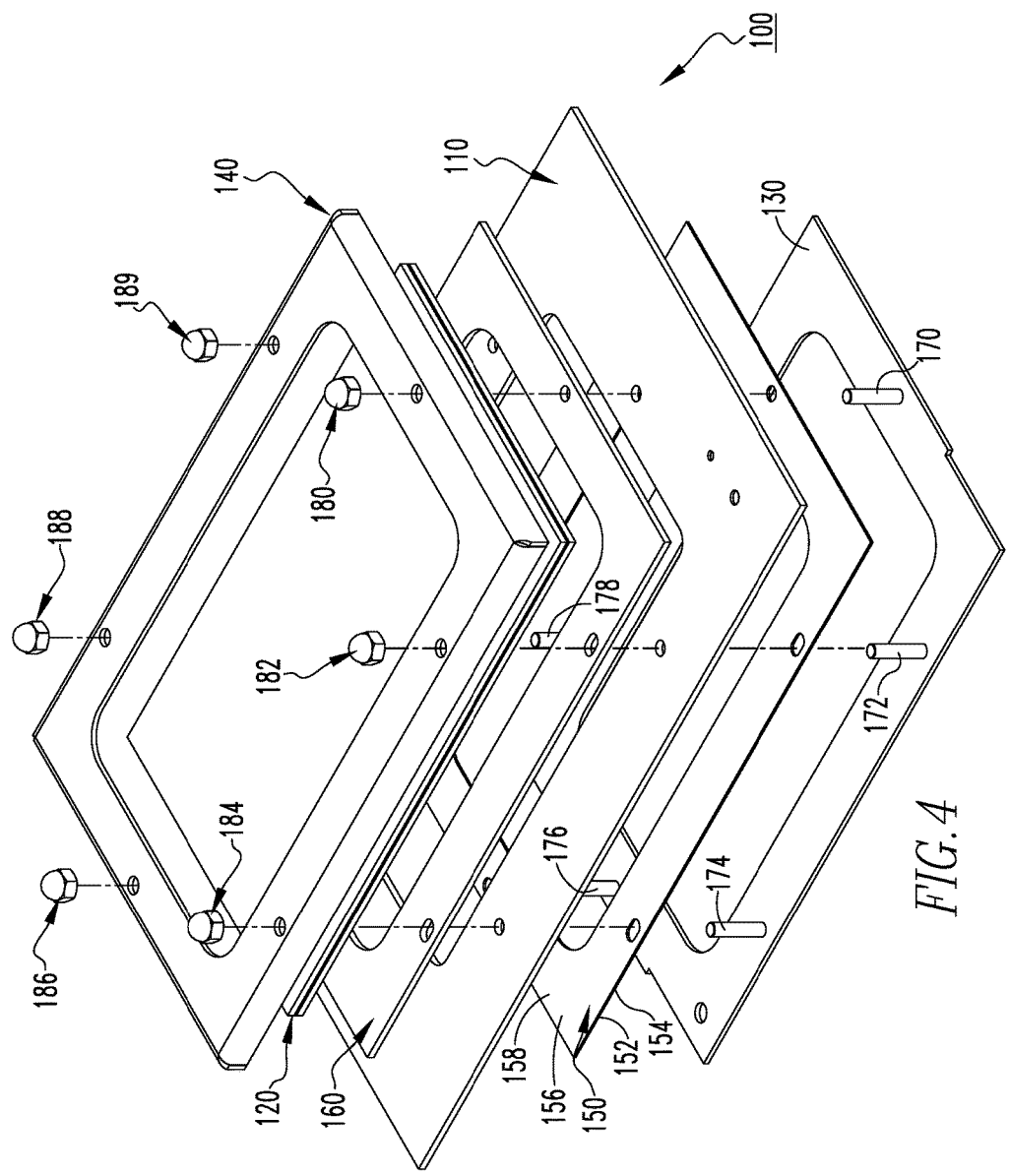
FIG. 4 is an exploded front isometric view of the portion of the window assembly of FIG. 2.

The window assembly 100 includes a cover member (e.g., without limitation, door 110) that is coupled to the walls 4,6 in order to form an enclosed region, and a window member 120 coupled to the door 110. The window member 120 is transparent (i.e., made of a suitable material such as, for example and without limitation, glass or polycarbonate) in order to allow operating personnel to view inside the electrical enclosure 2. FIGS. 2 through 4 show different views of a portion of the window assembly 100 (i.e., only a portion of the relatively large door 110 is shown in FIGS. 2 through 4 for ease of illustration). As shown in FIGS. 3 and 4, the window assembly 100 further includes an inner frame member 130, an outer frame member 140, a number of gasket members 150,160, a number of cylindrical-shaped stud members 170,172,174,176,178, and a number of coupling members 180,182,184,186,188,189. The window member 120 and the outer gasket member 160 each partially overlay (i.e., are partially located on top of when viewed from a top plan view) the door 110. Additionally, the outer gasket member 160 is enclosed by the door 110 and the window member 120, and the window member 120 is partially enclosed by the outer frame member 140 and the door 110. As shown, the outer gasket member 160 is located between the door 110 and the window member 120 in order to provide a seal therebetween. This is advantageous for purposes of preventing undesirable entry of water and/or debris into the electrical enclosure 2.

Continuing to refer to FIG. 4, each of the stud members 170,172,174,176,178 (i.e., and the other stud member (not shown) opposite the stud member 172) has an end portion that is permanently secured to the inner frame member 130. For example and without limitation, each of the stud members 170,172,174,176,178 may be first permanently secured to the inner frame member 130 by way of a press-fit mechanism wherein tooling (e.g., without limitation, an anvil and a punch (not shown)) applies a squeezing force to embed the stud members 170,172,174,176,178 in the inner frame member 130. More specifically, in one example embodiment the stud members 170,172,174,176,178 are screw-shaped and are permanently secured to the inner frame member 130 in a manner wherein during assembly the material of the inner frame member 130 flows (i.e., by way of the squeezing force of the tooling (not shown)) under a head portion of the stud members 170,172,174,176,178 in order to embed the stud members 170,172,174,176,178 in the inner frame member 130. It will also be appreciated that the stud members 170,172,174,176,178 may be permanently secured to the inner frame member 130 by way of a welded joint and/or a threaded connection wherein the inner frame member 130 has a number of threaded holes and each of the stud members 170,172,174,176,178 is threaded in order to be threadably coupled to a respective threaded hole of the inner frame member 130. In this manner, absent the application of a relatively significant external force, the stud members 170,172,174,176,178 and the inner frame member 130 are not separable. Furthermore, in the example shown and described herein, the door 110, the window member 120, the gasket members 150,160, and the outer frame member 140 each have a number of clearance holes (i.e., thru holes) that correspond with and slidably receive a corresponding one of the stud members 170,172,174,176, 178.

During assembly, the stud members 170,172,174,176,178 are extended through the clearance holes of the inner gasket member 150, which has a pressure sensitive adhesive layer 152 on a first side 154 facing the inner frame member 130, and another pressure sensitive adhesive layer 156 on a second, opposing side 158 facing the door 110. As the inner gasket member 150 is located between the inner frame member 130 and the door 110, the adhesive layers 152,156 facilitate assembly by temporarily securing the door 110 to the inner frame member 130. Next, the stud members 170,172,174,176,178 are extended through the clearance holes of the door 110, the clearance holes of the outer gasket member 160, the clearance holes of the window member 120, and the clearance holes of the outer frame member 140. Finally, each of the coupling members 180,182,184,186, 188,189 is coupled (i.e., secured) to an opposing end portion (i.e., opposite the inner frame member 130) of a corresponding one of the stud members 170,172,174,176,178 such that the door 110, the window member 120, the outer frame member 140, and the gasket members 150,160 are located between the coupling members 180,182,184,186,188,189 and the inner frame member 130. In this manner, the door 110, the window member 120, the inner frame member 130, the outer frame member 140, and the gasket members 150,160 are each coupled together. Accordingly, it will be appreciated that the door 110 is located between the inner frame member 130 and the window member 120. This configuration is distinct from prior art window assemblies (not shown), which do not include inner frame members (e.g., and inner gasket members) and in which doors are not located between frame members and window members because of their reliance on having stud members be permanently secured to the doors.

As discussed above, manipulating relatively large doors presents significant assembly challenges. In accordance with the disclosed concept, the inner frame member 130 weighs significantly less than the door 110 in order to simplify assembly, minimize potential damage to components such as the stud members 170,172,174,176,178, and make field repairs more easy. More specifically, the inner frame member 130 preferably has a weight that is less than 10 percent of a weight of the door 110. This is distinct from prior art window assemblies (not shown) in which stud members are permanently secured to relatively heavy doors. As a result of the novel structure, the relatively lightweight inner frame member 130 can be manipulated (i.e., moved by an operator and aligned with other components, as discussed above) during assembly instead of the door 110. This allows operators to relatively easily align the stud members 170,172,174, 176,178 with the clearance holes of the door 110, the window member 120, the outer frame member 140, and the gasket members 150,160. Additionally, because the inner frame member 130 can easily be manipulated by an operator, the likelihood that the outwardly protruding stud members 170,172,174,176,178 will inadvertently contact and be damaged (i.e., bent or fractured) by any nearby structures during assembly is significantly minimized.

It will be understood that the stud members 170,172,174, 176,178 are coupled to, but are not permanently secured to, the door 110, the window member 120, the gasket members 150,160, and the outer frame member 140. In other words, during assembly (i.e., before the coupling members 180, 182,184,186,188,189 are secured to the respective stud members 170,172,174,176,178), the door 110, the window member 120, the gasket members 150,160, and the outer frame member 140 can each be easily removed from the stud members 170,172,174,176,178 and the inner frame member 130. Stated differently, the clearance holes of the door 110, the window member 120, the gasket members 150,160, and the outer frame member 140 are each defined by an edge portion having a respective length (i.e., circumference) that is greater than a respective length (i.e., circumference) of a corresponding one of the stud members 170,172,174,176, 178. This is distinct from prior art window assemblies (not shown) in which the stud members are permanently secured (i.e., tightly fitted) to the cover member (e.g., the door). As such, in the event that field repairs are required to the window assembly 100 (i.e., in the event that one of the stud members 170,172,174,176,178 is damaged), the relatively large and heavy door 110 does not need to be removed from the electrical enclosure 2. That is, because the stud members 170,172,174,176,178 are permanently secured to the inner frame member 130 and not the door 110, the relatively lightweight inner frame member 130 can easily and quickly be removed, and repaired or replaced, rather than having to remove and re-install the relatively large and heavy door 110.

It will be appreciated that a method of assembling the window assembly 100 includes the steps of aligning the stud members 170,172,174,176,178 with the clearance holes of the door 110 and the clearance holes of the window member 120, and extending each of the stud members 170,172,174, 176,178 through a corresponding one of the clearance holes of the door 110 and a corresponding one of the clearance holes of the window member 120 such that the door 110 is located between and is coupled to the inner frame member 130 and the window member 120. Furthermore, the extending step includes moving the inner frame member 130 toward the door 110. The method further includes extending the stud members 170,172,174,176,178 through the inner gasket member 150 before the door 110 and the window member 120 such that the inner gasket member 150 is located between the inner frame member 130 and the door 110 in order to provide a seal therebetween. The method further includes extending the stud members 170,172,174, 176,178 through the outer gasket member 160 after the door 110 such that the outer gasket member 160 is located between the window member 120 and the door 110 in order to provide a seal therebetween, and extending each of the stud members 170,172,174,176,178 through the outer frame member 140 after the window member 120. Additionally, the method includes coupling each of the coupling members 180,182,184,186,188,189 to a corresponding one of the stud members 170,172,174,176,178 such that the door 110 and the window member 120 are located between the inner frame member 130 and the coupling members 180,182,184, 186,188,189. Finally, the method further includes permanently securing the stud members 170,172,174,176,178 to the inner frame member 130.

Although the disclosed concept has been described herein in association with the electrical enclosure 2, it will be appreciated that any suitable alternative enclosure (not shown) having a viewable window member other than an electrical enclosure may likewise be structured and be assembled according to the teachings disclosed herein. Additionally, window assemblies (not shown) having other suitable alternative configurations are contemplated by the disclosed concept. For example and without limitation, although the window member 120 has been described herein as having clearance holes to receive the stud members 170,172,174,176,178, it is within the scope of the disclosed concept for a suitable alternative window member (not shown) to not include clearance holes to receive the stud members 170,172,174,176,178, but rather be a continuous component devoid of thru holes that is located internal with respect to, and that is corralled by or maintained by the stud members 170,172,174,176,178. Furthermore, it is within the scope of the disclosed concept for a suitable alternative window assembly (not shown) to not include the gasket members 150,160 (e.g., without limitation, in an indoor environment).

Accordingly, it will be appreciated that the disclosed concept provides for an improved (e.g., without limitation, easier to assemble, more reliable, less likely to be damaged) enclosure 2, and window assembly 100 and assembling method therefor, which among other benefits, secures a number of stud members 170,172,174,176,178 to a frame member 130 and locates a door 110 between the frame member 130 and a window member 120 in order to allow the relatively lightweight frame member 130 to be manipulated during assembly and/or repair, as opposed to a relatively heavy door 110.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A window assembly for an enclosure, said window assembly comprising:
a cover member;
a first frame member coupled to said cover member;
a second frame member coupled to said cover member; and
a window member coupled to and disposed between said cover member and said first frame member,
wherein said cover member is disposed between said second frame member and said window member
wherein said window assembly further comprises a number of elements extending through said cover member in order to couple said cover member, said first frame member, said second frame member, and said window member together.

2. The window assembly of claim 1 wherein each of said number of elements extends through at least one of said first frame member and said second frame member.

3. The window assembly of claim 1 further comprising a gasket member disposed between and sealingly engaged with said window member and said cover member.

4. The window assembly of claim 1 further comprising a gasket member disposed between and sealingly engaged with said cover member and said second frame member.

5. The window assembly of claim 1 wherein said cover member has a first weight; wherein said first frame member has a second weight; wherein said second frame member has a third weight; and wherein the second weight and the third weight are each 10 percent or less than the first weight.

6. The window assembly of claim 5 wherein said number of elements are a number of stud members secured to one of said first frame member and said second frame member.

7. The window assembly of claim 6 wherein each of said number of stud members is not permanently secured to said cover member.

8. The window assembly of claim 6 wherein each of said number of stud members is permanently secured to said first frame member.

9. The window assembly of claim 6 wherein each of said number of stud members is permanently secured to said second frame member.

10. An enclosure comprising:
a plurality of walls; and
a window assembly comprising:
a cover member coupled to each of said plurality of walls in order to form an enclosed region,
a first frame member coupled to said cover member,
a second frame member coupled to said cover member, and
a window member coupled to and disposed between said cover member and said first frame member,
wherein said cover member is disposed between said second frame member and said window member.

11. The enclosure of claim 10 wherein said window assembly further comprises a number of elements extending through said cover member in order to couple said cover member, said first frame member, said second frame member, and said window member together.

12. The enclosure member of claim 11 wherein each of said cover member and said window member has a number of clearance holes in order to slidably receive a corresponding one of said number of elements.

13. The enclosure of claim 12 wherein said number of clearance holes is a plurality of clearance holes; and wherein said number of elements is a plurality of elements each extending through a corresponding one of the clearance holes of said cover member and said window member.

14. The enclosure of claim 12 wherein at least one of said first frame member and said second frame member has a number of clearance holes in order to slidably receive a corresponding one of said elements.

15. The enclosure of claim 14 wherein at least one of said first frame member and said second frame member is said first frame member; and wherein said number of elements are a number of stud members permanently secured to said second frame member.

16. The enclosure of claim 14 wherein at least one of said first frame member and said second frame member is said second frame member; and wherein said number of elements are a number of stud members permanently secured to said first frame member.

17. A method of assembling a window assembly, said window assembly comprising a number of elements, a cover member having a number of clearance holes, a first frame member coupled to said cover member, a second frame member coupled to said cover member, and a window member disposed between said cover member and said first frame member, said window member having a number of clearance holes, said cover member being disposed between said second frame member and said window member, the method comprising the steps of:
aligning said number of elements with the clearance holes of said cover member and the clearance holes of said window member; and
extending each of said number of elements through a corresponding one of the clearance holes of said cover member and a corresponding one of the clearance holes of said window member in order to couple said cover member, said first frame member, said second frame member, and said window member together.

18. The method of claim 17 wherein one of said first frame member and said second frame member has a number of clearance holes; and wherein the method further comprises the step of:
extending each of said number of elements through a corresponding one of the clearance holes of said one of said first frame member and said second frame member.

19. The method of claim 18 wherein said number of elements are a number of stud members permanently secured to the other of said one of said first frame member and said second frame member.

20. An enclosure comprising:
a plurality of walls;
a cover member coupled to at least one of said plurality of walls in order to form an enclosed region;
a first frame member;
a second frame member coupled to said first frame member, and
a window member disposed between said first frame member and said second frame member, said cover member being disposed between said first frame member and said second frame member.

21. The enclosure of claim 20 further comprising a number of elements extending through said cover member in order to couple said cover member, said first frame member, and said second frame member together.

22. The enclosure of claim 20 wherein said first frame member is an inner frame member disposed in the enclosed region; wherein said second frame member is an outer frame member disposed external with respect to the enclosed region; and wherein said window member is disposed between said cover member and said outer frame member.

23. The enclosure of claim 20 wherein said cover member has a first weight; wherein said first frame member has a second weight; wherein said second frame member has a third weight; and wherein the second weight and the third weight are each 10 percent or less than the first weight.

24. A window assembly for an enclosure having a cover member, said window assembly comprising:
a first frame member;
a second frame member;
a window member structured to be disposed between said cover member and said first frame member; and
a number of elements structured to extend through said cover member in order to couple said first frame member to said second frame member.

* * * * *